(12) United States Patent
Iijima et al.

(10) Patent No.: US 8,299,363 B2
(45) Date of Patent: Oct. 30, 2012

(54) POLYCRYSTALLINE THIN FILM, METHOD FOR PRODUCING THE SAME AND OXIDE SUPERCONDUCTOR

(75) Inventors: Yasuhiro Iijima, Tokyo (JP); Satoru Hanyu, Tokyo (JP)

(73) Assignees: Fujikura Ltd., Tokyo (JP); The Juridical International Superconductivity Technology Center, Tokyo (JP)

( * ) Notice: Subject to any disclaimer, the term of this patent is extended or adjusted under 35 U.S.C. 154(b) by 410 days.

(21) Appl. No.: 12/569,601

(22) Filed: Sep. 29, 2009

(65) Prior Publication Data

US 2010/0012349 A1    Jan. 21, 2010

Related U.S. Application Data

(63) Continuation of application No. PCT/JP2008/056160, filed on Mar. 28, 2008.

(30) Foreign Application Priority Data

Mar. 29, 2007 (JP) .................................. 2007-089479
Nov. 1, 2007 (JP) .................................. 2007-285452

(51) Int. Cl.
*H01B 12/00* (2006.01)
(52) U.S. Cl. ..................................... 174/125.1; 505/230
(58) Field of Classification Search .................. 174/15.4, 174/15.5, 125.1; 505/230–232, 430–432
See application file for complete search history.

(56) References Cited

U.S. PATENT DOCUMENTS

| 6,270,908 | B1 * | 8/2001 | Williams et al. ............... 428/469 |
| 6,933,065 | B2 | 8/2005 | Arendt et al. |
| 2004/0026118 | A1 | 2/2004 | Muroga et al. |
| 2004/0028954 | A1 | 2/2004 | Arendt et al. |
| 2007/0238619 | A1 * | 10/2007 | Xiong ........................... 505/100 |

FOREIGN PATENT DOCUMENTS

| JP | 04-329865 A | 11/1992 |
| JP | 2000-277009 A | 10/2000 |
| WO | 99/25908 A1 | 5/1999 |
| WO | 01/40536 A1 | 6/2001 |

OTHER PUBLICATIONS

James R. Grooves et al. Ion-Beam Assisted Deposition of Bi-axially Aligned MgO Template Films for YBCO Coated Conductors, IEEE Transactions on Applied Superconductivity, 1999, vol. 9, No. 2, pp. 1964-1966.
Satoshi Hanyu et al. "Sekiso IBAD Chukanso Kiban no Kaihatsu", Meeting on Cryogenics and Superconductivity, Nov. 20, 2007, Dai 77 Kai, p. 199.

* cited by examiner

*Primary Examiner* — Jeremy Norris
(74) *Attorney, Agent, or Firm* — Sughrue Mion, PLLC

(57) ABSTRACT

An object of the invention is to provide a polycrystalline thin film which includes an intermediate layer that is made thinner while keeping high crystal orientation so as to prevent warpage of a substrate resulting from internal stress of the film. A polycrystalline thin film according to the invention includes an intermediate layer formed by a first layer and a second layer laminated in this order and provided on a metal substrate. The first layer has a rock-salt crystal structure and the second layer has a fluorite crystal structure.

15 Claims, 6 Drawing Sheets

POLYCRYSTALLINE THIN FILM, METHOD FOR PRODUCING THE SAME AND OXIDE SUPERCONDUCTOR

FIELD OF THE INVENTION

The present invention relates to a polycrystalline thin film, a method for producing the same and an oxide superconductor. More particularly, the invention relates to a polycrystalline thin film which can be made thinner while keeping high crystal orientation, a method for producing the same and an oxide superconductor incorporating the polycrystalline thin film. Priority is claimed on Japanese Patent Application No. 2007-089479, filed Mar. 29, 2007, and on Japanese Patent Application No. 2007-285452, filed Nov. 1, 2007, the contents of which are incorporated herein by reference.

BACKGROUND ART

A RE-123-based oxide superconductor ($REBa_2Cu_3O_{7-x}$, in which RE represents a rare earth element including Y) which has been found recently exhibits superconductivity at a temperature higher than a liquid nitrogen temperature. It is therefore expected as a promising material from a practical standpoint. There is a strong demand to use the linearly-processed RE-123-based oxide superconductor as a conductor for electric power supply.

As a method for processing an oxide superconductor into a linear material, the following method is under consideration. A metal material which is highly strong, heat resistive and is easily processed into a linear material is first formed as an elongated tape. An oxide superconductor is then deposited as a thin film on the tape-shaped metal substrate.

The oxide superconductor has electric anisotropy such that the flow of electricity is promoted along a and b crystal axes of the crystals itself, but the flow of electricity is impeded along a c crystal axis of the crystals itself. Accordingly, if the oxide superconductor is provided on a substrate, it is necessary to orient the a and b crystal axes so as to promote the flow of electricity and orient the c crystal axis along another direction.

However, the metal substrate itself is an amorphous material or a polycrystalline material which has a crystal structure significantly different from that of the oxide superconductor. It is therefore difficult to form an oxide superconductor film having high crystal orientation on the substrate. A difference in coefficients of thermal expansion and lattice constants between the substrate and the superconductor may cause distortion in the superconductor or peeling-off of the oxide superconductor film from the substrate during a cooling process to a superconducting critical temperature.

As an approach to address these problems, an intermediate layer (i.e., a buffer layer) is first provided on the metal substrate and an oxide superconductor film is formed on the intermediate layer. The intermediate layer consists mainly of MgO, YSZ (yttria-stabilized zirconium), $SrTiO_3$ or the like each having a physical characteristic value, such as a coefficient of thermal expansion and a lattice constant, intermediate with respect to the values of the substrate and the superconductor.

In the intermediate layer, the c crystal axis of each crystal thereof are oriented at a right angle with respect to a surface of the substrate, but the a crystal axis (or the b crystal axis) of each crystal thereof are not in-plane oriented along the substantially same direction. Accordingly, the oxide superconductive layer to be provided on the surface of the substrate also has the a crystal axis (or the b crystal axis) each of which are not oriented the substantially same direction in-plane direction, thereby failing to increase critical current density Jc.

This problem is eliminated by the ion beam assist method (IBAD method). In the IBAD method, constituent particles ejected from a target by sputtering are deposited on a substrate while being irradiated with argon ions, oxygen ions or other ions at the same time emitted from an ion gun at a tilted angle (e.g., 45 degrees). According to the IBAD method, an intermediate layer having high orientation of the c crystal axis and high in-plane orientation of the a crystal axis with respect to a film deposition surface on the substrate can be provided.

FIGS. 6 and 7 illustrate an example in which a polycrystalline thin film as an intermediate layer is formed on the substrate by the IBAD method. In FIG. 6, a reference numeral 100 denotes a plate-like substrate and 110 denotes a polycrystalline thin film formed on an upper surface of the substrate 100.

The polycrystalline thin film 110 is formed by plural fine crystal grains 120, each having a cubic structure, joined together at grain boundaries. The c crystal axis of each crystal grain 120 is oriented at a right angle with respect to the upper surface (i.e., a film deposition surface) of the substrate 100. The a crystal axis and the b crystal axis of each crystal grain 120 are in-plane oriented along the same direction with each other. The c crystal axis of each crystal grain 120 is oriented at a right angle with respect to the film deposition surface (i.e., the upper surface) of the substrate 100. The crystal grains 120 are joined together with the a crystal axis (or the b crystal axis) being angled (i.e., grain boundary angle K illustrated in FIG. 7) at 30 degrees or less.

Although the IBAD method is considered as a highly practical method in that it provides linear materials with excellent mechanical properties and that stable high characteristics are easy to obtain, the intermediate layer formed by the IBAD method (hereinafter, also referred to as a "IBAD intermediate layer") has been considered not to have high orientation unless the thickness is not less than about 1000 nm. A deposition rate in the IBAD method is as slow as about 3 nm/min since crystal orientation is controlled by ion beam impact on a non-orientated metal tape. This may take a longer time for film deposition and thus is inferior in productivity.

As a method for addressing this problem, development and study have been made intensively to use a fluorite-based oxide, such as YSZ and GdZrO (see, for example, Patent Documents 1 and 2) and a rock-salt-based oxide, such as MgO (see, for example, the Patent Document 1).

In the former method, because of the simple lamination structure and wider conditions for film deposition, elongation has been achieved earlier. However, since it is necessary to make the intermediate layer thicker, a production rate becomes low. There is also a problem that the internal stress of the film became large which may cause warpage of the substrate.

The latter method is expected to fundamentally solve the above-described problem. Since plural extremely thin films having a thickness of not more than several tens of nanometers are laminated together in this method, however, various kinds of technical know-how have been needed in order to keep the same narrow conditions for film deposition over the elongated substrate.

[Patent Document 1] U.S. Pat. No. 6,933,065
[Patent Document 2] International publication No. 2001-040536

DESCRIPTION OF THE INVENTION

Problems to be Solved by the Invention

The invention has been devised in view of the aforementioned circumstances, and a first object thereof is to provide a polycrystalline thin film which includes an intermediate layer that is made thinner without sacrificing high crystal orientation so as to prevent warpage of a substrate resulting from internal stress of the film.

A second object of the invention is to provide an oxide superconductor which has high crystal orientation, high critical current density and high superconductivity and in which warpage of a substrate resulting from internal stress of the film is prevented.

Means for Solving the Problem

A polycrystalline thin film according to claim 1 of the invention includes an intermediate layer formed by a first layer and a second layer laminated in this order and provided on a metal substrate, in which the first layer has a rock-salt crystal structure and the second layer has a fluorite crystal structure.

The polycrystalline thin film according to claim 2 of the invention, the first layer and the second layer have different orientation axes, the first layer being <111>-oriented and the second layer being <100>-oriented.

The polycrystalline thin film according to claim 3 of the invention, the second layer includes a <111>-oriented initial region and a (100)-oriented growing region.

The polycrystalline thin film according to claim 4 of the invention, the first layer and the second layer have the same orientation axes that are (100)-oriented.

A method for producing the polycrystalline thin film according to claim 5 of the invention includes an intermediate layer formed by a first layer and a second layer laminated in this order and provided on a metal substrate, the first layer having a rock-salt crystal structure and the second layer having a fluorite crystal structure, in which the first layer and the second layer are formed by an ion beam assist method.

The oxide superconductor according to claim 6 of the invention includes at least an intermediate layer formed by a first layer and a second layer laminated together, a cap layer and an oxide superconductive layer laminated together in this order on a metal substrate, in which the first layer has a rock-salt crystal structure and the second layer has a fluorite crystal structure.

Effects of the Invention

According to the invention, since the first layer has a rock-salt crystal structure and the second layer has a fluorite crystal structure, the intermediate layer can be made thinner while keeping high crystal orientation. With this configuration, a polycrystalline thin film in which internal stress of the film is reduced to prevent warpage of the substrate can be provided.

Since the intermediate layer can be made thinner as compared to the related art while keeping high crystal orientation, the manufacturing speed can be significantly increased and the manufacturing cost can be reduced.

In the invention, since the first layer has a rock-salt crystal structure and the second layer has a fluorite crystal structure, which altogether form the intermediate layer, the intermediate layer can be made thinner while keeping high crystal orientation. With this configuration, an oxide superconductor which has high crystal orientation, high critical current density and high superconductivity while reducing the internal stress of the film to prevent warpage of the substrate can be provided.

Figure 1:
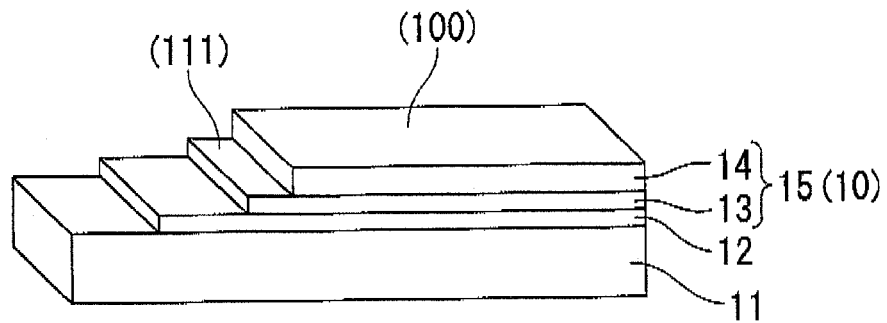
FIG. 1 is a diagram schematically illustrating an exemplary polycrystalline thin film according to the invention.

BRIEF DESCRIPTION OF THE REFERENCE SYMBOLS 10, 20, 36 polycrystalline thin films
11, 21, 31 metal substrates
12, 22, 32 bed layers
13, 23, 33 first layers
14, 24, 34 second layers
15, 25, 35 intermediate layers
30 oxide superconductor
37 cap layer
38 oxide superconductive layer

BEST MODES FOR IMPLEMENTING THE INVENTION

Hereinafter, embodiments of a polycrystalline thin film and an oxide superconductor according to the invention will be described with reference to the drawings.

<First Embodiment>

FIG. 1 is a diagram schematically illustrating an exemplary polycrystalline thin film 10 according to the invention.

The polycrystalline thin film 10 of the invention includes an intermediate layer 15 formed by a first layer 13 and a second layer 14 laminated in this order and provided on a metal substrate 11 via a bed layer 12. The first layer 13 has a rock-salt crystal structure and the second layer 14 has a fluorite crystal structure.

In the invention, the intermediate layer 15 is formed as a laminated product of the first layer 13 and the second layer 14. Since the first layer 13 has the rock-salt crystal structure and the second layer 14 has the fluorite crystal structure, the intermediate layer 15 can be made thinner while keeping high crystal orientation. With this configuration, the polycrystalline thin film 10 with internal stress of the film being reduced and warpage of the metal substrate 11 being prevented can be provided.

Examples of the material of the first layer 13 having a rock-salt crystal structure include an oxide represented by a composition formula γO, a nitride represented by δN or a carbide represented by a εC. The γ herein represents a divalent metallic element, the δ represents a trivalent metallic element and the ε represents a tetravalent metallic element, Especially preferred examples of the γ include alkaline-earth metals, such as Be, Mg, Ca, Sr and Ba. Especially preferred examples of the δ and ε include Ti, Zr, Hf, V, Nb and Ta. The first layer 13 may include one of these elements, or may include two or more of these elements.

Examples of the second layer 14 having a fluorite crystal structure include a material represented by a composition formula $(\alpha_1O_2)_{2x}(\beta_2O_3)_{(1-x)}$. In the composition formula, α represents Zr, Hf, Ti or a tetravalent rare earth element (e.g., Ce), β represents a trivalent rare earth element and x is in an amount of $0 \leq x \leq 1$. It is especially preferred that α is Zr or Hf and x is in an amount of $0.4 \leq x \leq 1.0$.

In particular, a thinner intermediate layer 15 having good orientation can be provided by a combination of two IBAD intermediate layers 15 having different characteristics. An intermediate layer 15 of $Gd_2Zr_2O_7$ (hereinafter, referred to as "GZO") having a fluorite crystal structure that has a required thickness of not less than 1000 nm (the second layer 14 in the present embodiment) is combined with an intermediate layer 15 of MgO having a rock-salt crystal structure (the first layer 13 in the present embodiment). Accordingly, a half width (Δφ) of crystal axis distribution in the in-plane direction can be reduced to not greater than 15 degrees at the thickness of not greater than 300 nm. Since the thickness of the intermediate layer can be reduced to half or less as compared to the related art, the manufacturing speed can be significantly increased and the manufacturing cost can be reduced.

Since the GZO intermediate layer 15 (i.e., the second layer 14) having a fluorite crystal structure is laminated on the MgO intermediate layer 15 (i.e., the first layer 13), even if the intermediate layer 15 (i.e., the first layer 13) has low quality having a half width in the in-plane direction of not greater than 15 degrees at the thickness of not less than 300 nm, an oxide superconductive layer (e.g., the YBCO) having high orientation, high characteristics and a stable yield can be provided on the polycrystalline thin film 10.

Although the metal substrate 11 is formed as a tape in the present embodiment, the invention is not limited to the same and may alternatively be a plate material, a linear material, a strip material and the like. Examples of the metal substrate 11 include various metallic materials, such as silver, platinum, stainless steel, copper and nickel alloys, such as Hastelloy, or various metallic materials having various ceramic materials provided thereon and the like.

The bed layer 12 having high heat resistance is provided to reduce interface reactivity, The bed layer 12 functions to impart orientation to a coat provided thereon. Such a bed layer 12 is provided as necessary and is formed of, for example, yttria ($Y_2O_3$), silicon nitride ($Si_3N_4$) and aluminum oxide ($Al_2O_3$, also referred to as alumina). The bed layer is formed by, for example, sputtering to a thickness of 10 to 100 nm.

The intermediate layer 15 is formed by a laminated product of the first layer 13 and the second layer 14.

The first layer 13 has a rock-salt crystal structure. Examples of the material having a rock-salt crystal structure include MgO.

The second layer 14 has a fluorite crystal structure. Examples of the material having a fluorite crystal structure include YSZ and GZO.

As illustrated in FIG. 1, in the intermediate layer 15 which is incorporated in the polycrystalline thin film 10, the first layer 13 and the second layer 14 have differently-oriented axes. Namely the first layer 13 is <111>-oriented and the second layer 14 is <100>-oriented.

With this configuration, since the first layer 13 and the second layer 14 have differently-oriented axes, a degree of freedom in selecting the material of the first layer or specification of the film structure of the first layer can be significantly increased.

In the present example, the second layer is (100)-oriented even if the first layer is a (111)-oriented film. An in-plane orientation of the oxide superconductive layer with a vertically-oriented c crystal axis can therefore be reliably controlled by employing the second layer. Since the first layer has a function to fix the in-plane axis of the second layer, the thickness of the second layer can be made very thin as compared with related art layers.

If an oxide superconductive layer (e.g., YBCO) is formed on the polycrystalline thin film 10, by employing a <111>-oriented MgO intermediate layer 15 (i.e., the first layer 13) which has a thickness of as much as not less than 30 nm, high orientation and high characteristics can be provided in the oxide superconductive layer, resulting in a more stable yield.

In this case, the thickness of the first layer 13 is preferably in a range of 5 to 200 nm and the thickness of the second layer 14 is preferably in a range of 100 to 300 nm. If the thickness of the first layer is less than 5 nm, stability in the thickness thereof is no longer ensured which may cause variation in the thickness. If the oxide superconductive layer is formed on the polycrystalline thin film 10, the smallest thickness of the second layer 14 depends also on a thickness of the cap layer 11 (i.e., a $CeO_2$ layer) formed thereon. The thickness of the second layer 14 may be not less than 10 nm, preferably not less than 50 nm and more preferably not less than 100 nm. If the thickness of the second layer 14 is less than 10 nm, the degree of orientation is not less than 10 degrees even after a $CeO_2$ layer is vapor-deposited thereon and the critical current flowing therethrough becomes insufficient.

The total thickness of the first layer 13 and the second layer 14 exceeding 500 nm is not desirable because the internal stress of the first layer 13 and the second layer 14 increase, which may increase the internal stress of the entire polycrystalline thin film 10 and may cause the polycrystalline thin film 10 to be easily peeled off from the metal substrate 11. The total thickness of the first layer 13 and the second layer 14 exceeding 500 nm is not desirable also because of increased surface roughness and decreased critical current density.

The thickness of the first layer 13 and the second layer 14 can be increased or decreased by adjusting the feeding speed of the metal substrate 11.

The second layer 14 is preferably formed by a <111>-oriented initial region and a <100>-oriented growing region. With this configuration an interface of the <111>-oriented first layer 13 and the second layer 14 is stabilized. Accordingly, the <100>-oriented second layer 14 can be formed on the <111>-oriented first layer 13 via the <111>-oriented initial region of the second layer 14 with high reproducibility with less strict manufacturing requirements imposed. In an area from the initial region to the growing region of the second layer 149 the axis of the initial region falls along the laminating direction of the first layer 13 and the second layer 14 and the orientation gradually changes from the <111>-orientation toward the <100>-orientation.

<Second Embodiment>

Next, a second embodiment of the polycrystalline thin film according to the invention will be described. In the following description, description will be given mainly to components different from those of the first embodiment described above and description of similar components will be omitted.

Figure 2:
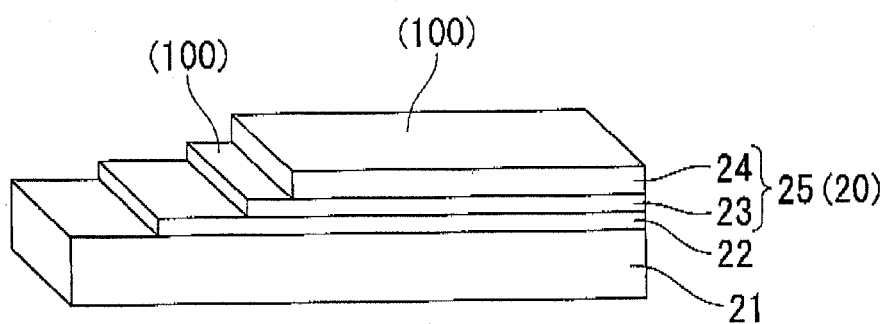
FIG. 2 is a diagram schematically illustrating an exemplary polycrystalline thin film according to the invention.

FIG. 2 is a diagram schematically illustrating an exemplary polycrystalline thin film 20 according to the invention.

The polycrystalline thin film 20 of the invention includes an intermediate layer 25 formed by a first layer 23 and a second layer 24 laminated in this order and provided on a metal substrate 21 via a bed layer 22. The first layer 23 has a rock-salt crystal structure and the second layer 24 has a fluorite crystal structure.

The intermediate layer 25 is formed as a laminated product of the first layer 23 and the second layer 24. Since the first layer 23 has the rock-salt crystal structure and the second layer 24 has the fluorite crystal structure, the intermediate layer 25 can be made thinner while keeping high crystal orientation. With this configuration, the polycrystalline thin film 10 with internal stress of the film being reduced and warpage of the metal substrate 11 being prevented can be provided.

In the intermediate layer 25 which forms the polycrystalline thin film 20, the first layer 23 and the second layer 24 have the same, <100>-orientation axes.

In this manner, if the first layer 23 and the second layer 24 have the same orientation axes, even if the orientation of the first layer is varied, the variation can be stabilized by the second layer and sharp orientation can be expected.

In controlling the in-plane orientation of the oxide superconductive layer with vertically-oriented c crystal axis, since the in-plane crystal axis of the oxide superconductive layer should be (100)-oriented, it is therefore necessary that both the first layer 23 and the second layer 24 are (100)-oriented in this case. As in the first embodiment, since the first layer has a function to fix the in-plane axis of the second layer, the thickness of the second layer can be made very thin as compared with related art layers.

In this case, the thickness of the first layer 23 is preferably in a range of 5 to 200 nm and the thickness of the second layer 24 is preferably in a range of 100 to 300 nm for the same reason as in the above-described first embodiment.

Next, an oxide superconductor incorporating the foregoing polycrystalline thin film will be described.

Figure 3:
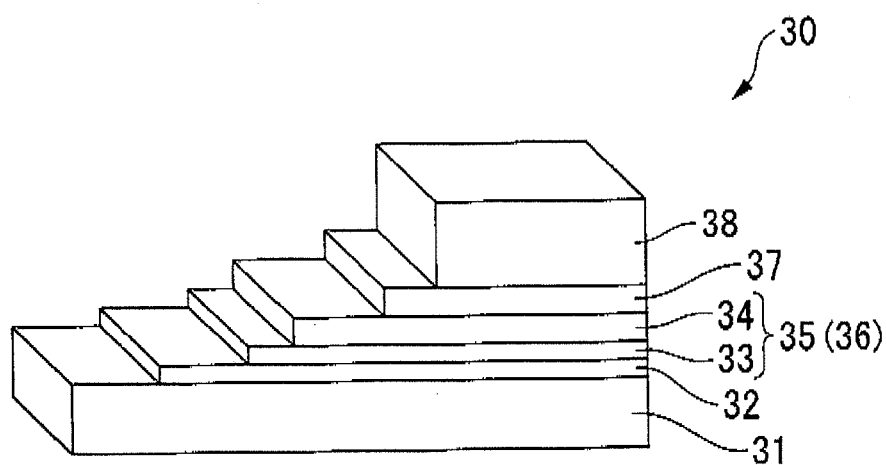
FIG. 3 is a diagram schematically illustrating an exemplary oxide superconductor according to the invention.

FIG. 3 is a diagram schematically illustrating an exemplary oxide superconductor according to the invention.

The oxide superconductor 30 of the invention includes at least an intermediate layer 35 formed by a first layer 33 and a second layer 34 laminated in this order and provided on a metal substrate 31 via abed layer 32, a cap layer 37 and an oxide superconductive layer 38 which are laminated together. The first layer 33 has a rock-salt crystal structure and the second layer 34 has a fluorite crystal structure.

In the invention, since the first layer 33 and the second layer 34, altogether forming the intermediate layer 35 in the polycrystalline thin film have a rock-salt crystal structure and a fluorite crystal structure, respectively, the intermediate layer can be made thinner while keeping high crystal orientation. With this configuration, internal stress of the film is reduced and warpage of substrate is prevented. Thus, an oxide superconductor with high crystal orientation, high critical current density and high superconductivity can be provided.

The cap layer 37 is formed as a $CeO_2$ layer. Note that the $CeO_2$ layer does not necessarily consist only of $CeO_2$ and may alternatively include a Ce-M-O-based oxide having a part of Ce substituted by another metal atom or another metal ion. The $CeO_2$ layer can be formed by, for example, the PLD method (pulse laser deposition) or sputtering. Among these, the PLD method is desirable from the high film-forming speed standpoint. The $CeO_2$ layer can be deposited by the PLD method with a substrate temperature being about 500 to 800° C. and laser energy density being 1 to 5 $J/cm^2$ in an oxygen gas atmosphere of about 0.6 to 40 Pa.

For sufficient orientation of the $CeO_2$ layer, the thickness of the $CeO_2$ layer may be not less than 50 nm, more preferably not less than 100 nm and even more preferably not less than 500 nm. The thickness of the $CeO_2$ layer may be preferably in a range of 500 to 600 nm since the $CeO_2$ layer with excessively large thickness may have poor crystal orientation.

Examples of a material of the oxide superconductive layer 38 include a RE-123-based oxide superconductor ($REBa_2Cu_3O_{7-X}$, in which RE represents a rare earth element including Y, La, Nd, Sm, Eu and Gd). Preferred examples of the RE-123-based oxide include Y123 ($YBa_2Cu_3O_{7-X}$, hereinafter referred to as "YBCO") and Sm123 ($SmBa_2Cu_3O_{7-X}$, hereinafter referred to as "SmBCO").

Oxide superconductive layer 38 can be formed by the normal forming-membranes method. It is preferred, however, to employ a TFA-MOD method (organic metal deposition method and application thermal decomposition method using trifluoroacetic acid salt), a PLD method or a CVD method from the productivity standpoint.

In the MOD method, metal organic acid salt is thermally decomposed after being applied. After a solution uniformly dissolving an organic compound of a metallic component is applied onto the substrate, the applied solvent is heated to induce thermal decomposition. In this manner, a thin film is formed on the substrate. Since the MOD method eliminates the need of any vacuum process and can provide high speed film deposition at low cost, the MOD method is suitable for manufacturing an elongated tape-shaped oxide superconductor.

As described above, after the oxide superconductive layer 37 is formed on the polycrystalline thin film 36 which has high orientation, the oxide superconductive layer 37 laminated on the polycrystalline thin film 36 is also crystallized in accordance with the orientation of the polycrystalline thin film 1. Accordingly, the oxide superconductive layer 37 formed on the polycrystalline thin film 36 rarely has disordered crystal orientation. In each of the crystal grains which constitute the oxide superconductive layer 37, the c crystal axis of the each crystal grain is oriented along the thickness direction of the metal substrate 31 so as to impede the flow of electricity and the a axes or b axes of the each crystal grain are oriented along a longitudinal direction of the metal substrate 2. Since the obtained oxide superconductive layer 12 is excellent in quantum connectivity in grain boundaries and rarely has deterioration in superconductivity in the grain boundaries, the flow of electricity is promoted along the longitudinal direction of the metal substrate 2 and sufficiently high critical current density can be obtained.

As described above, in the invention, a combination of IBAD intermediate layers having different crystal structures in the polycrystalline thin film may provide a thinner intermediate layer with high orientation. An intermediate layer of GZO having a fluorite crystal structure that has a required thickness of not less than 1000 nm (i.e., the second layer) is combined with an intermediate layer of MgO having a rock-salt crystal structure (i.e., the first layer). Accordingly, a half width in the in-plane direction of the second layer can be reduced to not greater than 15 degrees at the thickness of the second layer being not greater than 300 nm. With this configuration, internal stress of the film is reduced and warpage of the substrate is prevented.

Although the polycrystalline thin film and the oxide superconductor according to the invention have been set forth in the foregoing description, the invention is not limited thereto and modifications can be made as necessary.

For example, although the polycrystalline thin film is applied to the oxide superconductor in the present embodiment, the invention is not limited thereto. The polycrystalline thin film of the invention can be applied to any of an optical thin film, a magnetic thin film of a magneto-optical disc, a thin film for fine wiring for integrated circuits, a dielectric thin film used for, for example, a high-frequency waveguide, a high pass filter and a hollow resonator.

That is, if these thin films are deposited on a polycrystalline thin film having high crystal orientation by a film forming method, such as sputtering, laser vapor deposition, vacuum deposition, and CVD (chemical vapor deposition), orientation of these thin films become high since these thin films accumulate or grow with good compatibility with the polycrystalline thin film.

These thin films may provide high quality thin films having high orientation. Accordingly, for an optical thin film, a thin film having excellent optical property can be obtained. For a magnetic thin film, a thin film having excellent magnetic property can be obtained. For a thin film for wiring, a thin film that rarely causes migration can be obtained. For a dielectric thin film, a thin film having excellent dielectric property can be obtained.

EXAMPLES

First, a film deposition device employing the IBAD method in the present Example will be described.

Figure 4:
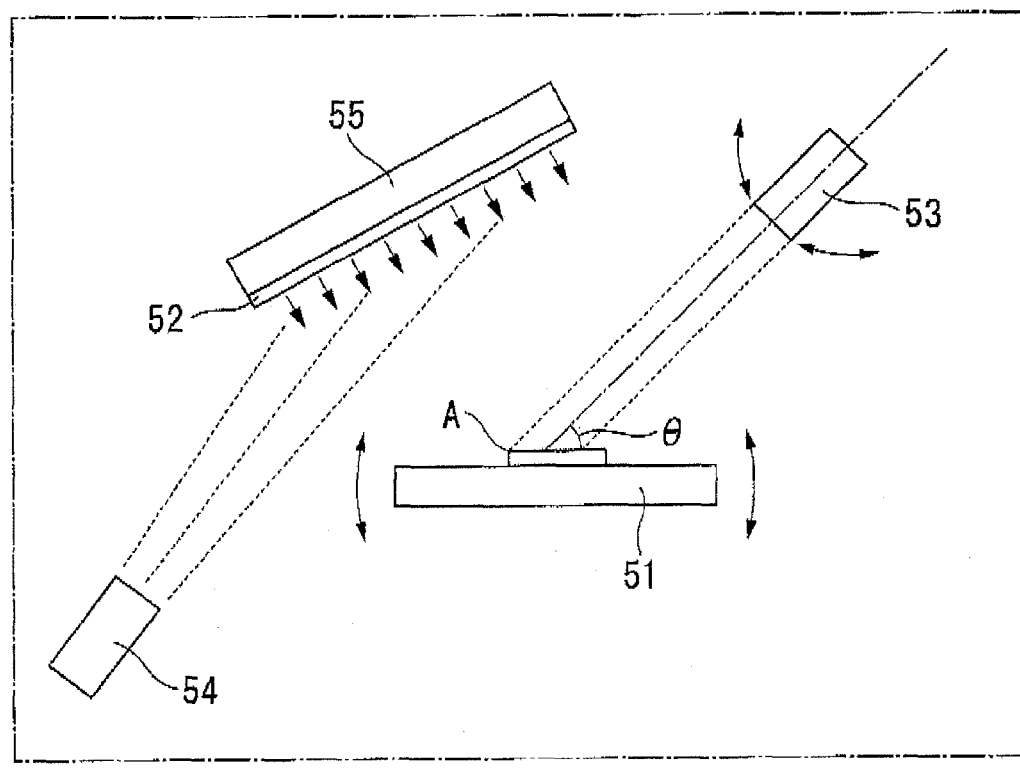
FIG. 4 is a diagram schematically illustrating a film deposition device which employs an IBAD method.

FIG. 4 illustrates an exemplary device for producing a polycrystalline thin film, including an ion gun for ion beam assistance provided in a sputtering device.

This film deposition device includes, as main components, a substrate holder 51, a plate-like target 52, an ion gun 53 and a sputter-beam emitter 54. The substrate holder 51 holds a substrate A in a horizontal position. The plate-like target 52 is positioned obliquely upward with respect to and opposes the substrate holder 51 at a predetermined distance. The ion gun 53 is positioned obliquely upward with respect to and opposes the substrate holder 51 at a predetermined distance and is spaced apart from the target 52. The sputter-beam emitter 54 is positioned below the target 52 and is made to face a lower surface of the target 52. A reference numeral 55 in the drawing denotes a target holder which is holding the target 52.

The above-described device is housed in a vacuum container, which is not illustrated, so that the substrate A is placed in a vacuum atmosphere. An atmosphere gas supply source, such as a gas bomb, is connected to the vacuum container. With this configuration, the inside of the vacuum container can be kept at a low pressure state, such as a vacuum state, and also can be kept at an argon gas atmosphere or other inert gas atmospheres, or an inert gas atmosphere including oxygen.

If an elongated metal tape is used as the substrate A, it is preferred to provide a sending device and a take-up device of the metal tape inside of the vacuum container. The substrate A is continuously sent from the sending device toward the substrate holder 51 and the sent substrate A is then taken up by the take-up device. With this configuration, the film deposition of the polycrystalline thin film can be carried out continuously on the tape-shaped substrate.

The substrate holder 51 includes an incorporated heater which heats the substrate A placed on the substrate holder 51 to a necessary temperature. An angle adjustment mechanism for adjusting a horizontal angle of the substrate holder 51 is provided at a bottom of the substrate holder 51. The angle adjustment mechanism may also be attached to the ion gun 53 to adjust the angle of the ion gun 53 so as to control the irradiation angle of the ions.

The target 52 is provided for forming a desired polycrystalline thin film, and has the same or a similar composition as that of the polycrystalline thin film having a desired composition. Although the target 52 may include MgO or GZO, the invention is not limited thereto. Any target according to the polycrystalline thin film to be formed may be employed.

The ion gun 53 is configured to introduce gas to be ionized inside of the container and includes an extraction electrode in front thereof. The ion gun 53 ionizes a part of atoms or molecules of the gas and then emits ion beams while controlling the ionized particles by an electric field generated at the extraction electrode. The gas can be ionized by various methods, such as a high-frequency excitation method and a filament method. In the filament method, a tungsten-made filament is energized and heated to generate thermal electrons. The generated thermal electrons are made to collide with gas molecules in a high vacuum and thereby the gas molecules are ionized. In the high-frequency excitation method, gas molecules in the high vacuum are polarized in a high frequency electric field and are ionized.

Figure 5:
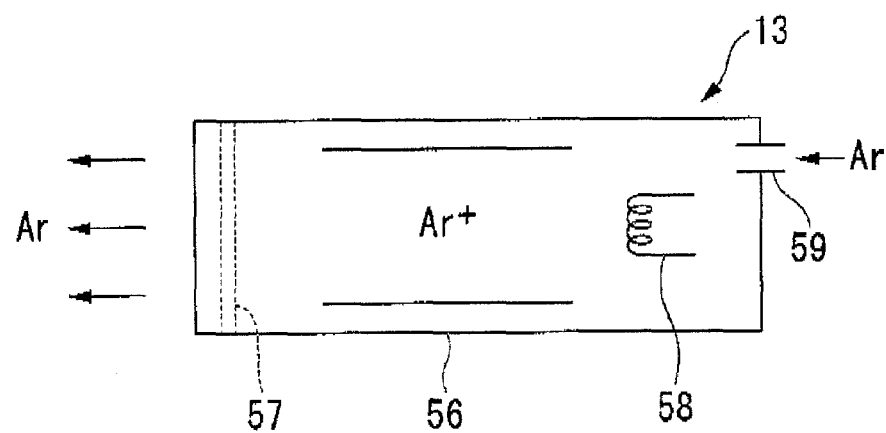
FIG. 5 is a diagram schematically illustrating an ion gun incorporated in a film deposition device illustrated in FIG. 4.
Figure 6:
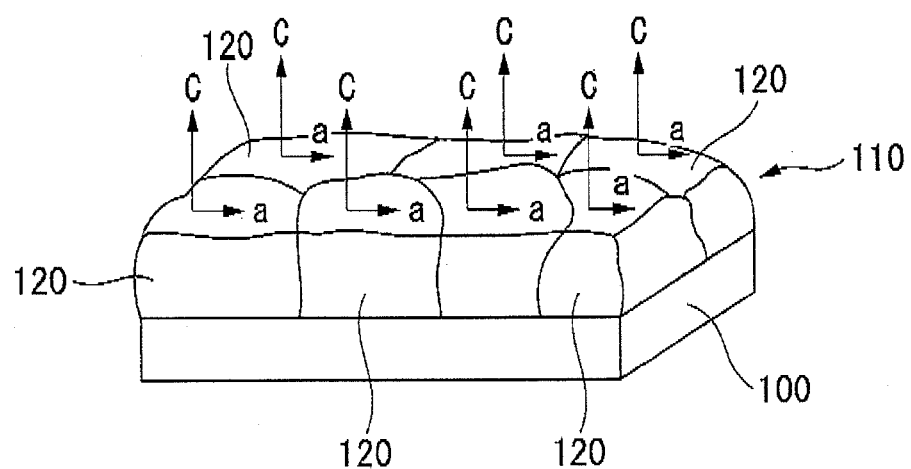
FIG. 6 is a diagram schematically illustrating an exemplary polycrystalline thin film of the related art.
Figure 7:
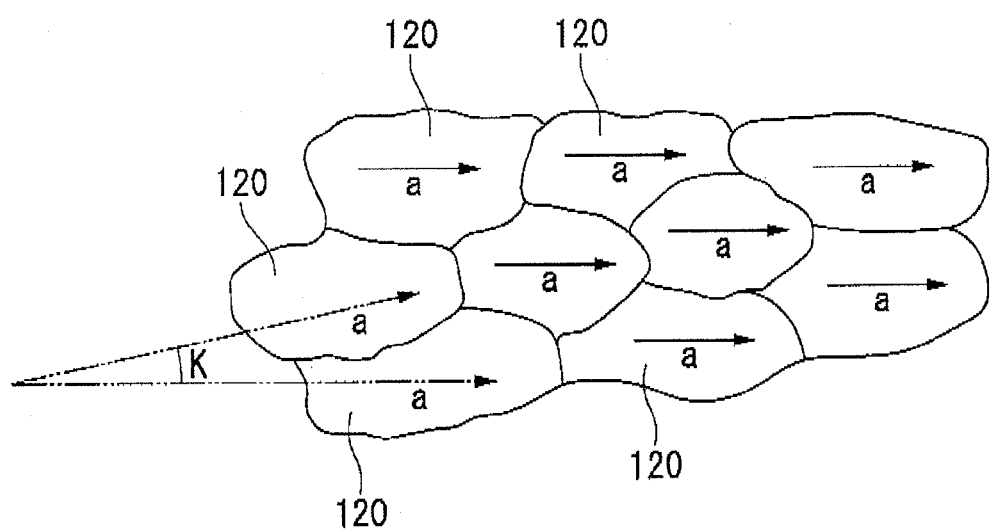
FIG. 7 is a diagram schematically illustrating an exemplary polycrystalline thin film of the related art.

In this example, the ion gun 53 having an internal structure illustrated in FIG. 5 is used. The ion gun 53 includes, in the inside of a cylindrical container 56, an extraction electrode 57, a filament 58, and an introduction tube 59 for introducing gases, such as Ar gas. The ion gun 53 can emit parallel ion beams at an end of the container 56.

As illustrated in FIG. 4, the ion gun 53 opposes the upper surface (i.e., the film deposition surface) of the substrate A with a central axis S thereof inclined at an angle θ. The angle θ is preferably in a range of 40 to 60 degrees and especially preferably about 45 degrees. Accordingly, the ion gun 53 is placed so as to emit ions with respect to the upper surface of the substrate A at the angle θ. Examples of the ions emitted onto the substrate A by the ion gun 53 include rare gas ions, such as $He^+$, $Ne^+$, $Ar^+$, $Xe^+$ and $Kr^+$, and a mix of the above rare gas ions and oxygen ions.

The sputter-beam emitter 54 has a similar configuration as that of the ion gun 53 and irradiates a target 52 with ions so that the constituent particles of the target 52 are ejected. Since it is important here that the constituent particle of the target 53 can be ejected by the invention device, voltage may be applied to the target 52 by, for example, a high-frequency coil so that the constituent particles of the target 52 can be ejected. In this case, the sputter-beam emitter 54 may be omitted.

Next, formation of the polycrystalline thin film on the substrate A using the thus-structured device will be described.

In order to form the polycrystalline thin film on the substrate A, a predetermined target is used and an angle adjustment mechanism is controlled such that the upper surface of the substrate holder 51 is irradiated at an angle of about 45 degrees with the ions emitted from the ion gun 53. Then, the inside of the container which houses the substrate is vacuum-suctioned to provide a reduced-pressure atmosphere. The ion gun 53 and the sputter-beam emitter 54 are started.

When the target 52 is irradiated with ions emitted from the sputter-beam emitter 54, the constituent particles of the target 52 are ejected and made to reach the substrate A. The constituent particles ejected from the target 52 are made to deposit on the substrate A and, at the same time, mixed ions of the Ar ions and the oxygen ions are emitted from the ion gun 53. The irradiation angle θ of the emitted ions is preferably in a range of 40 to 60 degrees when MgO is to be deposited, for example.

The a crystal axis and the b crystal axis of the polycrystalline thin film formed on the substrate A can be oriented through sputtering while the ions are emitted at the above-described angle. This is considered to be because the sputtered particles being deposited are irradiated with ions at a proper angle and thus are activated efficiently.

Example 1

As a metal substrate, a surface-polished Hastelloy tape having a width of 10 mm was used. A yttria ($Y_2O_3$) thin film (not thicker than 200 nm) was formed on the metal substrate by sputtering as a bed layer. An MgO film (not thicker than 200 nm) was then formed by the IBAD method as a first layer which constitutes an intermediate layer.

Subsequently, a GZO film having the thickness of about 200 nm was laminated on the MgO film by the IBAD method as a second layer which constitutes the intermediate layer. The MgO film and the GZO film were formed with ion beam assistance using rare gas ion beams, such as Ar, at a substrate temperature of not higher than 200° C.

A $CeO_2$ film is then formed on the GZO film to the thickness of 500 nm by the PLD method. Regarding the thus-obtained MgO film, GZO film and $CeO_2$ film, half widths of crystal axis distribution along an in-plane directions were measured. The result is shown in Table 1 (samples 1 to 4).

As Comparative Example, only the GZO film was formed as the intermediate layer on which the $CeO_2$ film was formed by the PLD method to the thickness of 500 nm. The measurement result regarding the half widths of Comparative Example is also shown in Table 1 (samples 5 and 6).

was successfully formed on a <111>-oriented intermediate layer (i.e., a first layer) of MgO having the half width of 20 degrees (sample 4). There is no precedent for integrity and production of the intermediate layer having an orientation structure clearly different from that of the first layer. Therefore, the invention has opened the way to reliably synthesize a high-performance film at high speed under wide conditions.

In the $CeO_2$ layer laminated by the PLD method on the intermediate layer consisting of GZO, the half width of the crystal axis distribution along the in-plane direction was about 4 degrees.

That is, in comparison of the samples 3 and 5 in Table 1, the intermediate layer of the sample 5 consisting of GZO has achieved the half width of 13.5 degrees at the thickness of 1400 nm while the intermediate layer of the sample 3 has achieved the similar half width (14.2 degrees) at the total thickness of 290 nm (i.e., the total thickness of the MgO intermediate layer (30 nm) and the GZO intermediate layer (260 nm)).

As described above, it has therefore been found that since the intermediate layers of the polycrystalline thin film produced in example 1 having different crystal structures are laminated (two-layered) with the first layer having a rock-salt crystal structure and the second layer having a fluorite crystal structure, the half width of the same level as that of the related art can be achieved by the intermediate layer having the thickness of one fifth of the related art. That is, according to the structure of the invention, since the thickness of the intermediate layer which constitutes the polycrystalline thin film can be made as thin as one fifth of the related art, the internal

TABLE 1

| | | IBAD-MgO | | IBAD-GZO | | $CeO_2$ | |
|---|---|---|---|---|---|---|---|
| | | Half Width [degree] | Film Thickness [nm] | Half Width [degree] | Film Thickness [nm] | Half Width [degree] | Film Thickness [nm] |
| Example 1 | Sample 1 | 22.4 | 30 | 15.5 | 100 | 4.4 | 500 |
| | Sample 2 | 22.6 | 30 | 14.5 | 260 | 4.1 | 500 |
| | Sample 3 | 20.6 | 30 | 14.2 | 260 | 4.6 | 500 |
| | Sample 4 | 19.2 | 30 | 11.1 | 260 | 2.7 | 500 |
| Comparative | Sample 5 | — | — | 13.5 | 1400 | 4.5 | 500 |
| Example 1 | Sample 6 | — | — | 29.7 | 100 | 13.5 | 500 |

Under suitable film deposition conditions, the MgO film has a <111>-axis being oriented at a right angle with respect to the substrate, a <100>-axis being oriented along the direction of the ion beams and the half width of the in-plane crystal axis of not greater than 20 degrees. The thus-structured thin film has a characteristic to be deposited as a film having the same structure under wide conditions and to have a varying thickness of about 5 to 200 nm.

In order to obtain a superconductive layer of high characteristic, the c crystal axis of the superconducting film should be oriented at a right angle with respect to the substrate, and the half width of the in-plane crystal axis should be not greater than 10 degrees. In order to obtain such a superconducting film through lattice matching with respect to the intermediate layer, it is indispensable to form an intermediate layer having a vertically-oriented <100>-axis in a cubic material and the half width of the in-plane crystal axis of not greater than 10 degrees. In order to reliably obtain such an intermediate layer, a fluorite-based intermediate layer consisting of GZO is laminated by the IBAD method. In this manner, an intermediate layer (i.e., a second layer) of GZO having the half width of about 10 degrees and a <100>-axis being vertically oriented stress of the film is reduced and warpage of the substrate which is a problem in the related art can be eliminated. Further, since the thickness of the intermediate layer is one fifth of the related art, the manufacturing speed can be significantly increased and the manufacturing cost can be reduced.

A YBCO superconductive layer was formed by the PLD method on the $CeO_2$ layer to the thickness of 1000 nm. As a result of evaluation of the characteristics, it was found that the YBCO superconductive layer had high characteristics, such as critical current density of $Jc=2$ $MA/cm^2$ and a critical current of $Ic=200$ A at the liquid nitrogen temperature.

Next conditions for forming the <111>-oriented first layer (i.e., the MgO film) were examined.

As in Example 1, after forming a yttria film on the metal substrate by sputtering, the MgO film (not thicker than 200 nm) was formed by the IBAD method as a first layer which constitutes the intermediate layer. At that time, the voltage of the sputtering ion gun was fixed to 1500 V and the current was set to 850 mA to 1000 mA. The voltage of the assist ion gun was fixed to 800 V and the current was set to 400 to 900 mA. The result is illustrated in Table 2.

TABLE 2

| | | Sputtering Ion Gun 1500 V | | |
|---|---|---|---|---|
| | | 850 mA | 950 mA | 1000 mA |
| Assist Ion Gun 800 V | 400 mA | | | |
| | 600 mA | | | |
| | 800 mA | ■ | ■ | |
| | 825 mA | | ■ | |
| | 835 mA | | ■ | ■ |
| | 875 mA | | | |
| | 900 mA | | | |

In Table 2, an area B represented by conditions shown with outline characters indicates that a <111>-oriented MgO film has been formed and an area A represented by gray solid conditions indicates that a <100>-oriented MgO film has been formed.

Figure 8:
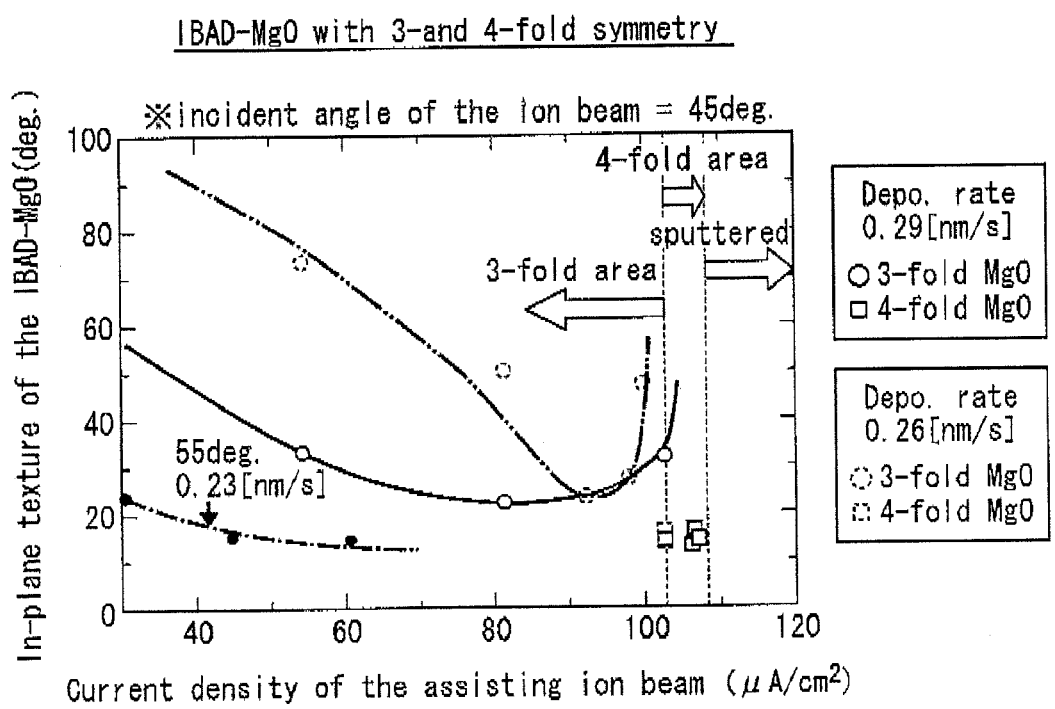
FIG. 8 is a diagram illustrating conditions for film deposition and a direction of an orientation axis of an MgO film.

FIG. 8 illustrates the conditions for film deposition and an oriented axis direction of the MgO film. A horizontal axis represents the ion current density and a vertical axis represents the half width of distribution of the in-plane crystal orientation of an orientation film. It has been found that under most conditions for film deposition, the orientation is <111>-oriented and in 3-fold area, and the <100>-oriented film is formed only in a narrow area having ion current density of about 100 μA/cm².

Table 2 and FIG. 8 illustrate that the <111>-oriented MgO film is formed under wide conditions while the <100>-oriented MgO film is obtained under limited conditions. Accordingly, the <111>-oriented MgO film can be formed in a wider margin area as compared with the <100>-oriented MgO film.

Figure 9:
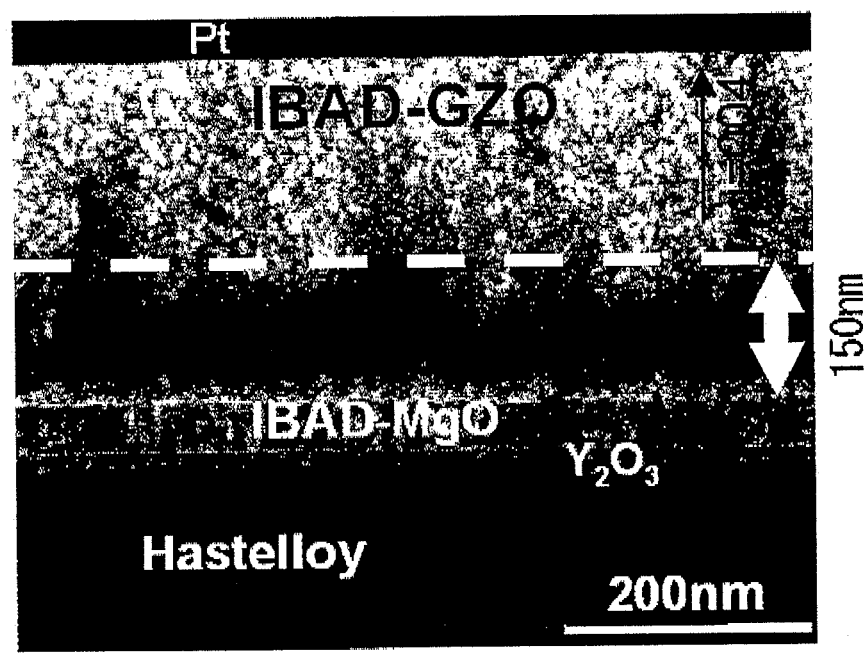
FIG. 9 is a diagram illustrating a cross-sectional TEM image at an interface of the MgO film and a GZO film.
Figure 11:
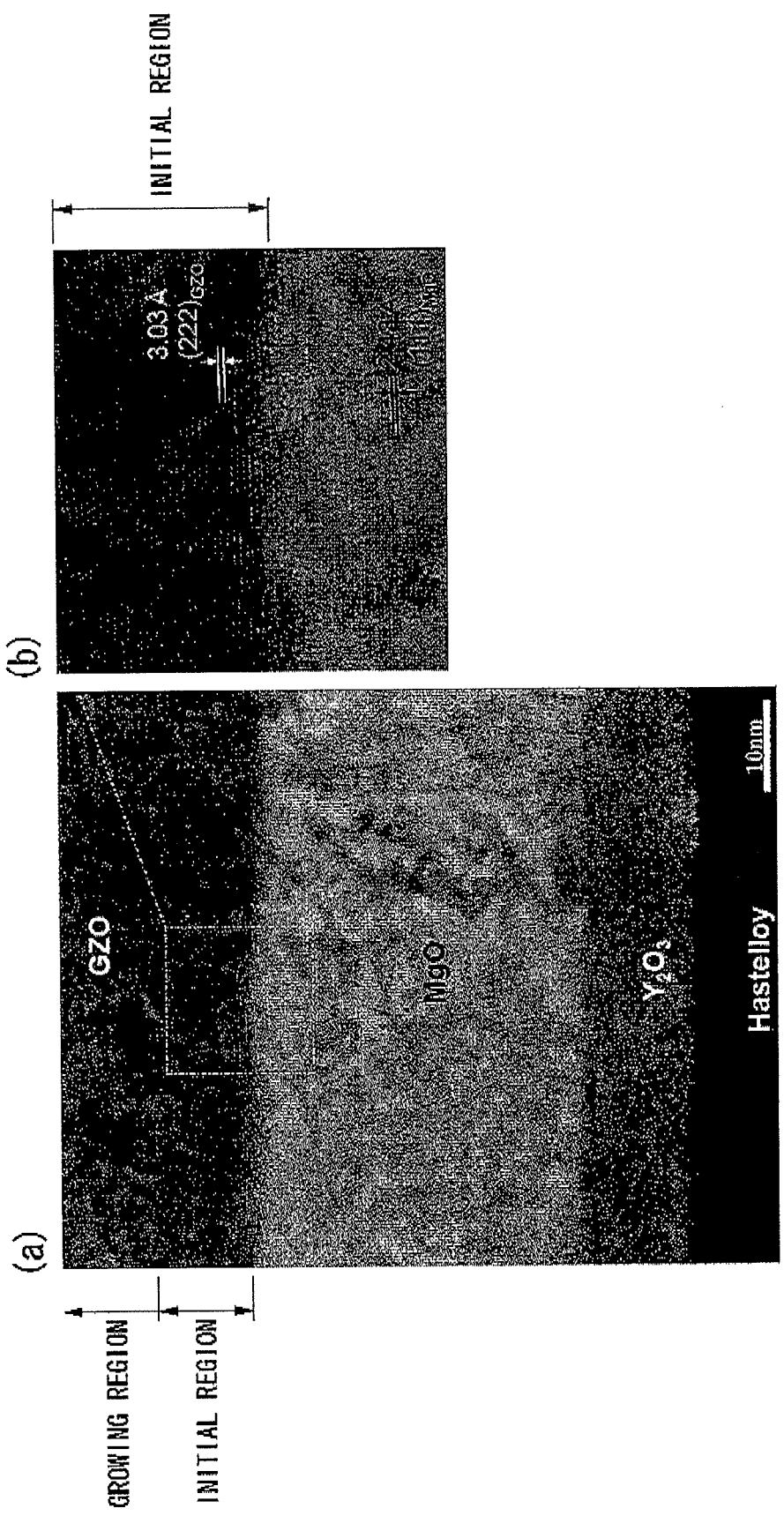
FIG. 11 is a diagram illustrating a diffraction pattern of the GZO film formed on the <111>-oriented MgO film.

Next, a cross-sectional image of a GZO film deposited by the IBAD method as in Example 1 on the (111)-oriented MgO film was observed using a transmission electron microscope (hereinafter referred to as "TEM"), The result is illustrated in FIGS. 9 and 11.

Figure 10:
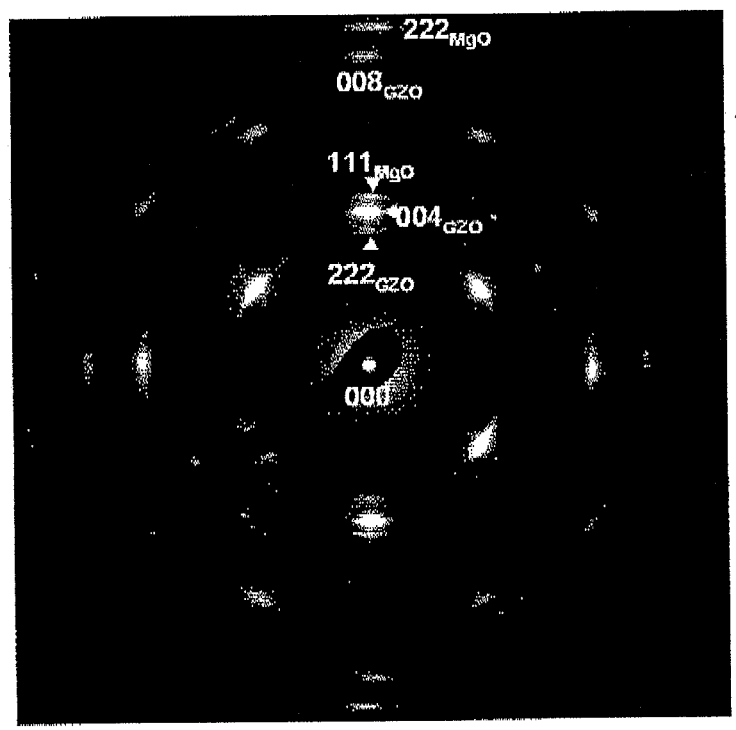
FIG. 10 is a diagram illustrating a cross-sectional TEM image of a growing region of the GZO film formed on a <111>-oriented MgO film.

FIG. 9 is a dark field cross-sectional TEM image of a sample obtained by laminating a yttria film, a MgO film and a GZO film in this order on a metal substrate. A Pt film is formed on the GZO film so as to reliably provide a sample piece when observing the cross section using the TEM. FIG. 10 illustrates a diffraction pattern of an emitted electron beam focused on the GZO film. The dark field TEM image illustrated in FIG. 9 is obtained by mapping signals from which a GZO (004) diffraction peak is extracted. Bright areas in the drawing indicate that the GZO film is <100>-oriented vertically with respect to the substrate. It is found that extremely bright areas near an upper film surface are strongly <100>-oriented. Dark areas, on the other hand, near the interface to the thickness of about 150 nm indicate that the <100>-oriented crystal grains rarely exist in those areas. The diffraction pattern illustrated in FIG. 10 in which the entire GZO film is irradiated with the electron beams has a diffraction peak (222) in addition to a diffraction peak (004), which implies a possibility that a (222)-oriented crystal grain exists in the areas near the interface.

FIG. 11 is a bright field TEM image illustrating a part of FIG. 9 as an enlarged view. FIG. 11(*a*) is an image of the metal substrate, the yttria film, the MgO film and the GZO film laminated together, FIG. 11(*b*) is a partially enlarged high resolution image of FIG. 11(*a*) illustrating the interface of the MgO film and the GZO film. Since it is a high resolution image, crystal structures can be directly confirmed in an atomic image, and orientation of the crystal structures can be specified. As illustrated in FIG. 11(*b*), it is confirmed that both the MgO film and the GZO film have vertically-oriented (111)-axes in an area near the interface.

As illustrated in FIGS. 9 to 11, the structure of the present Example has an initial region of (111)-oriented GZO film first laminated on the (111)-oriented MgO film and the (100)-oriented GZO film is made to grow on the initial region. With this configuration, the wide conditions for film deposition of the MgO film illustrated in Table 2 and FIG. 8 can be employed.

Example 2

As a metal substrate, a surface-polished Hastelloy tape having a width of 10 mm was used. A yttria ($Y_2O_3$) thin film (not thicker than 200 nm) was formed on the metal substrate by sputtering as a bed layer. An MgO film (not thicker than 200 nm) was then formed by the IBAD method as a first layer which constitutes an intermediate layer. Subsequently, a GZO film having the thickness of about 200 nm was laminated on the MgO film by the IBAD method as a second layer which constitutes the intermediate layer. The MgO film and the GZO film were formed with ion beam assistance using rare gas ion beams, such as Ar, at a substrate temperature of not higher than 200° C.

A $CeO_2$ film is then formed on the GZO film to the thickness of 500 nm by the PLD method. Regarding the thus-obtained MgO film, GZO film and $CeO_2$ film, the half widths of crystal axis distribution along the in-plane direction were measured.

As a result, it was found that the polycrystalline thin film produced in Example 2 had a similar tendency to that of the polycrystalline thin film of the above-described Example 1. It has therefore been found that since the intermediate layers having different crystal structures are laminated (two-layered) with the first layer having a rock-salt crystal structure and the second layer having a fluorite crystal structure, the half width of the same level as that of the related art can be achieved at an extremely thin intermediate layer. Accordingly, also in the polycrystalline thin film produced in Example 2, the internal stress of the film is reduced and warpage of the substrate which has been a problem in the related art can be eliminated. Further, since the intermediate layer is made extremely thin, the manufacturing speed can be significantly increased and the manufacturing cost can be reduced.

In more detail, under suitable conditions for film deposition, the MgO film has the <100>-axis oriented at a right angle with respect to the substrate, the <110> axis oriented along the direction of the ion beams, and the half width of the in-plane crystal axis of not greater than 10 degrees. However, these conditions were limited and if, for example, the thickness of the MgO film exceeded 10 nm, the half width increased rapidly. The half width was about 15 degrees at the thickness of 50 nm.

In order to obtain a superconductive layer of high characteristic, the half width should not be greater than 10 degrees. In order to reliably obtain such a super conductive layer, a fluorite-based intermediate layer of GZO was laminated by the IBAD method. In this manner, a <100>-oriented GZO intermediate layer having the half width of 10 degrees was successfully formed on an <100>-oriented MgO intermediate layer having the half width of 15 degrees.

A $CeO_2$ layer was formed to the thickness of 500 nm by the PLD method to provide the crystal axis distribution along the in-plane direction having the half width of about 4 degrees.

A YBCO superconductive layer was formed on the CeO$_2$ layer to the thickness of 1000 nm by the PLD method. As a result of evaluation of the characteristic, it was confirmed that high characteristics such as the critical current density of Jc=2 MA/cm$^2$ and the critical current of Ic=200 A were obtained at the liquid nitrogen temperature.

Next, conditions for forming the <100>-oriented first layer (MgO film) were examined.

As in Example 2, after an yttria film is formed on a metal substrate by sputtering, an MgO film (not thicker than 200 nm) was formed by the IBAD method as a first layer which constitutes the intermediate layer. At that time, voltage of the sputtering ion gun was fixed to 1500V and the current was set to 850 mA to 1000 mA. The voltage of the assistant ion beam was fixed to 800V and the current was set to 400 mA to 900 mA. The result is shown in Table 2 as in Example 1.

Table 2 shows that the <100>-oriented MgO film can be obtained under specific limited conditions.

[Industrial Applicability]

The invention is applicable to a polycrystalline thin film and an oxide superconductor.

The invention claimed is:

1. A polycrystalline thin film includes an intermediate layer formed by a first layer and a second layer laminated in this order and the intermediate layer provided on a metal substrate: wherein,
   the first layer has a rock-salt crystal structure and the second layer has a fluorite crystal structure.

2. The polycrystalline thin film according to claim 1, wherein the first layer and the second layer have different orientation axes, the first layer being <111>-oriented and the second layer being <100>-oriented.

3. The polycrystalline thin film according to claim 2, wherein the second layer includes a <111>-oriented initial region and a <100>-oriented growing region.

4. The polycrystalline thin film according to claim 1, wherein the first layer and the second layer have the same orientation axes that are <100>-oriented.

5. The polycrystalline thin film according to claim 1, wherein a bed layer is formed between the metal substrate and the first layer.

6. The polycrystalline thin film according to claim 5, wherein the bed layer is formed of yttria, silicon nitride, or aluminum oxide.

7. The polycrystalline thin film according to claim 1, wherein the first layer is formed of an oxide represented by a composition formula γO, a nitride represented by δN, or a carbide represented by a εC, and
   the γ represents a divalent metallic element, the δ represents a trivalent metallic element, and the ε represents a tetravalent metallic element.

8. The polycrystalline thin film according to claim 1, wherein the second layer is formed of a material represented by a composition formula $(\alpha_1 O_2)_{2x} (\beta_2 O_3)_{(1-x)}$ and
   the α represents Zr, Hf, Ti or a tetravalent rare earth element, the β represents a trivalent rare earth element, and the x is in an amount of $0 \leq x \leq 1$.

9. The polycrystalline thin film according to claim 1, wherein the first layer is formed of MgO and the second layer is formed of Gd$_2$Zr$_2$O$_7$.

10. The polycrystalline thin film according to claim 1, wherein a thickness of the first layer is in a range of 5 to 200 nm and a thickness of the second layer is in a range of 100 to 300 nm.

11. The polycrystalline thin film according to claim 1, wherein a half width of an in-plane crystal axis of the second layer is smaller than 10 degrees.

12. A method for producing a polycrystalline thin film which includes an intermediate layer formed by a first layer and a second layer laminated in this order and provided on a metal substrate, the first layer having a rock-salt crystal structure and the second layer having a fluorite crystal structure, wherein the first layer and the second layer are formed by an ion beam assist method.

13. An oxide superconductor includes at least an intermediate layer formed by a first layer and a second layer laminated together, a cap layer and an oxide superconductive layer laminated together in this order on a metal substrate: wherein,
   the first layer has a rock-salt crystal structure and the second layer has a fluorite crystal structure.

14. The polycrystalline thin film according to claim 13, wherein the cap layer is formed of CeO$_2$ or CeO$_2$ compound including a Ce—M—O-based oxide where the M is an atom or an ion of a metal.

15. The polycrystalline thin film according to claim 13, wherein the oxide superconductive layer is formed of a RE-123-based oxide superconductor including REBa$_2$Cu$_3$O$_{7-x}$, in which RE represents a rare earth element including Y, La, Nd, Sm, Eu and Gd.

* * * * *